US006590931B1

(12) United States Patent
Wittig

(10) Patent No.: US 6,590,931 B1
(45) Date of Patent: Jul. 8, 2003

(54) RECONFIGURABLE FIR FILTER USING CSD COEFFICIENT REPRESENTATION

(75) Inventor: Karl Wittig, New York, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/456,688

(22) Filed: Dec. 9, 1999

(51) Int. Cl.⁷ .............................................. H03H 21/00
(52) U.S. Cl. ..................................... 375/231; 708/301
(58) Field of Search ................................ 375/232, 229, 375/230; 708/300, 301, 303–323

(56) References Cited

U.S. PATENT DOCUMENTS

| | | | | |
|---|---|---|---|---|
| 4,967,388 A | * | 10/1990 | Tate | 708/628 |
| 5,081,604 A | * | 1/1992 | Tanaka | 708/319 |
| 5,262,974 A | * | 11/1993 | Hausman et al. | 708/493 |
| 6,282,184 B1 | * | 8/2001 | Lehman et al. | 370/342 |

FOREIGN PATENT DOCUMENTS

EP          766388 A2 *   4/1997  .......... H03H/17/02

OTHER PUBLICATIONS

LSI Logic Corp, Description, 1990 LSI Logic Corp, L64245 40 MHZ Versatile FIR Filter, pp. 1–12.
James M. Andersen, TRW, "Parameterizable CSD Multiplier for Digital Filter Applications", SMP, View/Methodology Notes.
Chao–Liang Chen and A.N. Willson Jr., "Higher Order ΣΔ Modulation Encoding for Design of Multiplierless FIR Filters", Electronics Letters, Nov. 26, 1998, vol. 34, No. 24, pp. 2298–2300.

M. Mehendale et al, "Coefficient Transformations for Area–Efficient Implementation of Multiplier–Less FIR Filters", 1997 IEEE, 1063–9667/ 1997, pp. 110–115.

M. Yagyu et al, "Design of Linear Phase FIR Digital Filters Using Minimal Number of Adders and Subtractors", 1996 IEEE, O–7803–3702–6/96, Proceedings of IEEE Asia Pacific Conf. on Circuits and Systems, 1996, Nov. 18–21, 1996, Seoul Korea, pp. 286–289.

W. Jin Oh and Y. Hoon Lee, "A Design and Implementation of Programmable Multiplierless FIR Filters with Powers of Two Coefficients", Dept. of Electrical Eng. Korea Advanced Institute of Science and Tech., Proceedings 1993 IEEE Int'L Symposium on Circuits and Systems, pp. 88–91.

Bor–Rong Horng et al, "The Design of Low–Complexity Linear–Phase FIR Filler Banks Using Powers–Of–Two Coefficients with an application to Subband Image Coding", IEEE Transactions on Circuits and Systems for Video Tech. vol. 1, No. 4, Dec. 1991, pp. 318–324.

* cited by examiner

*Primary Examiner*—Tesfaldet Bocure
*Assistant Examiner*—Pankaj Kumar
(74) *Attorney, Agent, or Firm*—Russell Gross

(57) ABSTRACT

The present invention is directed to a reconfigurable finite impulse response (FIR) filter that processes data tap values with canonical sign digit (CSD) coefficients. The FIR filter according to the present invention includes a shift group associated with at least one of the data tap values and at least one of the CSD coefficients. Each shift group includes a plurality of parallel paths. Each parallel path shifts the data tap value according to a bit pair of the coefficient to produce a weighted product. An adder is also included that combines the weighted products from each of the shift groups.

11 Claims, 10 Drawing Sheets

| COEFFICIENT | CSD REPRESENTATION | (VALUE) |
|---|---|---|
| 1 | 000000000+ | (+1) |
| 2 | 00000000-0 | (-2) |
| 3 | 0000000+0- | (+3) |
| 4 | 0000000000 | (0) |
| 5 | 000000-00+ | (-7) |
| 6 | 0000000+0+ | (+5) |
| 7 | 000000-0+0 | (-6) |
| 8 | 0000+0-00+ | (+25) |
| 9 | 000+0+0-0+ | (+77) |
| ••• | ••• | |
| N-4 | 000000+00- | (+7) |
| N-3 | 000000-000 | (-8) |
| N-2 | 0000000+0- | (+3) |
| N-1 | 0000000000 | (0) |
| N | 000000000- | (-1) |

FIG. 1
PRIOR ART

RECONFIGURABLE FIR FILTER USING CSD COEFFICIENT REPRESENTATION

BACKGROUND OF THE INVENTION

The present invention generally relates to digital filters, and more particularly to a finite-impulse response (FIR) filter that is reconfigurable for different sets of canonical sign digit (CSD) coefficients.

One technique for implementing FIR filters is the CSD representation. This technique provides a substantial advantage in the hardware implementation of FIR filters by eliminating the need for multipliers, which are the largest and most expensive components required to perform digital filtering operations. Instead, the CSD representation permits the minimization of the total number of non-zero bits in all of the filter coefficients that nevertheless maintains acceptable filter performance.

For each tap in a CSD representation filter, the data tap value is shifted by the number of bit positions corresponding to the position of each non-zero bit in the coefficient for that tap. The resulting shifted data tap values are then added. This is done for every coefficient in the filter. A primary consequence of this is that a larger adder (i.e., one with more data inputs) is required than would be needed for a conventional FIR filter implementation. However, this is still desirable since no multipliers are used. The high hardware cost of multipliers makes the CSD implementation especially attractive for very long digital filters. Such filters are often needed, for example, in communications systems, particularly for the demodulation of digital data signals.

In CSD filters, each coefficient is implemented by adding the associated data tap value shifted by a coefficient bit position. Since the shifting of the data tap values is usually a hard-wired function of the data bus, CSD filters are designed exclusively for a specific set of coefficients and thus cannot be reconfigured or programmed for different coefficients. This is in contrast with a conventional FIR filter, in which each coefficient is simply multiplied by the data tap value. Such a filter can easily be reconfigured if a programmable register is provided at the coefficient input of each data tap multiplier, so that every coefficient can be reconfigured to any desired value simply by programming that value into the register.

SUMMARY OF THE INVENTION

The present invention is directed to a reconfigurable or programmable FIR filter having coefficients that are represented using the canonical sign-digit (CSD) format. According to the present invention, the FIR filter can be reconfigured at any time by specifying (i.e., programming) different values for the coefficients, limited only by the constraints of maximum values for filter length, data and coefficient precision.

The FIR filter according to the present invention includes a shift group associated with at least one of the data tap values and at least one of the CSD coefficients. Each shift group includes a plurality of parallel paths. Each parallel path shifts the data tap value according to a bit pair of the coefficient to produce a weighted product. An adder is also included that combines the weighted products from each of the shift groups.

Further, each parallel path includes a shifting unit for shifting the data tap value a predetermined number of places corresponding to a position within the coefficient of a first bit of the bit pair. Each parallel path further includes an adder-input unit coupled to an output of the shift unit for further shifting the data tap value if a second bit of the bit pair is non-zero. The adder-input unit also passes the data tap value from the shifting unit unchanged to the adder if the second bit of the bit pair is zero. The adder-input unit also forces the data tap value from the shifting unit to zero if both bits of the bit pair are zero. The adder-input unit further inverts the data tap value from the shifting unit if one bit of the bit pair is negative.

The present invention is also directed to a method for processing a digital filter tap value with a canonical sign digit (CSD) coefficient. The method includes replicating the digital filter tap value to produce replicated tap values. The method also includes shifting each of the replicated tap values according to a bit pair of the CSD coefficient to produce weighted products and then adding the weighted products.

BRIEF DESCRIPTION OF THE DRAWING

Referring now to the drawings where like reference numbers represent corresponding parts throughout:

FIG. 1 is a diagram showing an example of the canonical sign-digit (CSD) representation of FIR filter coefficients;

DETAILED DESCRIPTION

Conventional FIR filters consist of cells equal in number to the length of the filter (i.e. the number of data taps). Each cell consists of a storage register, a second register and a multiplier. The storage register stores the data tap values, which are digital samples of the signal being processed by the filter. The second register stores the filter coefficient for a particular tap and the multiplier generates the product of the two register contents. The latter product serves as the output of the cell, and the weighted sum that constitutes the FIR filter output is generated by adding the outputs of all of the cells.

An example of the CSD representation for FIR filter coefficients is shown in FIG. 1. As can be seen, every coefficient bit has a value of only 0, +1, or −1. This is in contrast to the conventional binary representation, where the only bit values permitted are 0 and +1. A further restriction in the CSD representation is that two non-zero bits cannot be adjacent.

Figure 2:
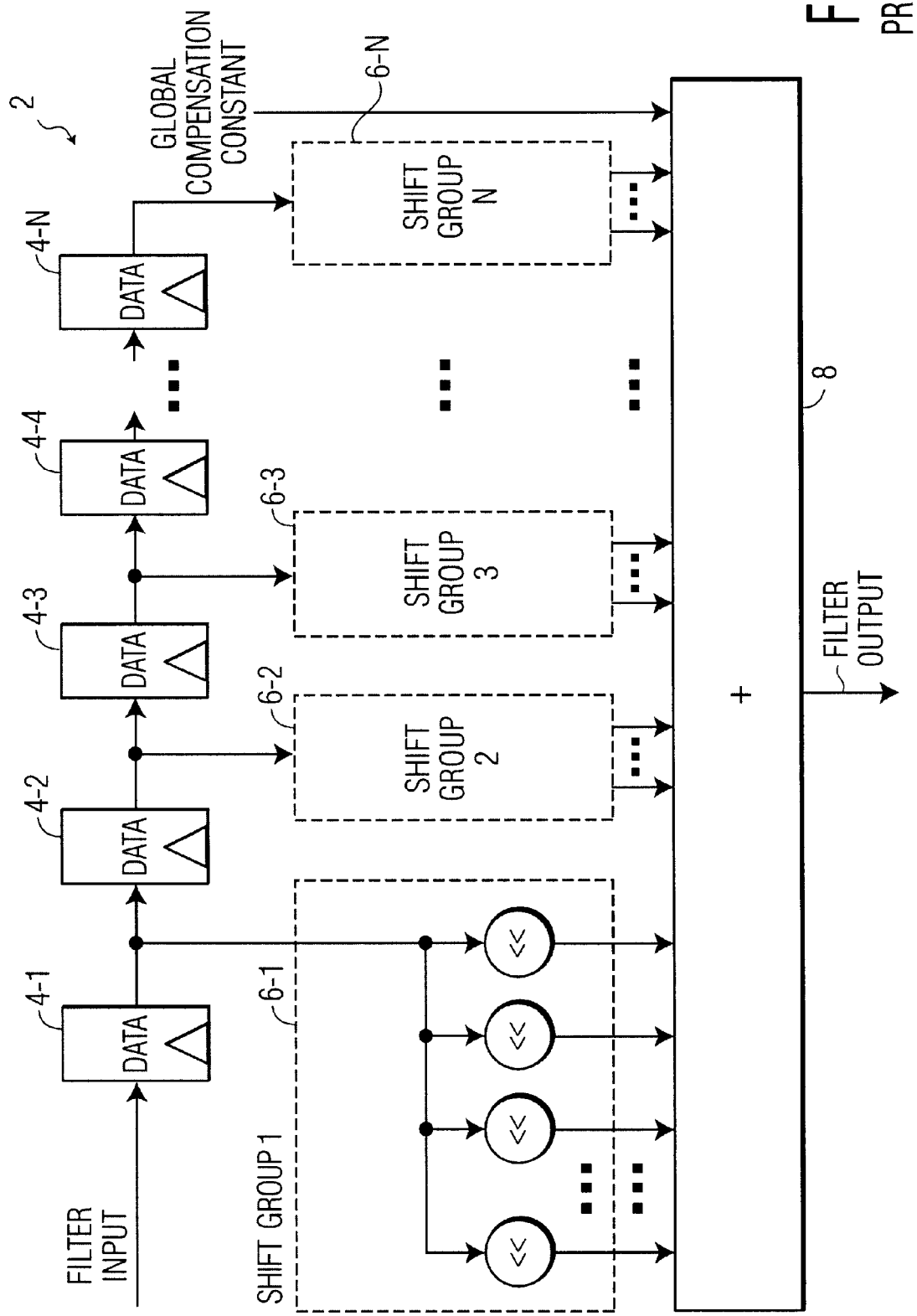
FIG. 2 is a diagram showing the conventional FIR filter with CSD coefficients.

The structure of a FIR filter implemented using CSD coefficients is shown in FIG. 2. As can be seen, the filter 2 includes data tap registers 4-1–4-N that store the data tap values and an adder 8 for generating the filter output. However, instead of using multipliers, the CSD representation uses shift groups 6-1–6-N to generate the weighted products that are combined by the adder 8 to produce the filter output. Each of these weighted products is represented as the sum of the data tap values weighted by each of the non-zero coefficient bits. The weighting of the data tap values is performed by shifting the tap data value according to the position within the CSD coefficient of the non-zero CSD bit in question. For example, if a non-zero CSD bit is in the second bit position, the data tap value will be shifted by one place.

However, if the CSD coefficient bit equals a −1, the data tap value is subtracted. Although, true subtraction of a signed twos-complement number is the correct operation to perform in this case, a ones-complement representation, which is just a bit-wise inversion of the data value, is much simpler to implement. Therefore, the ones complement being different from the correct value by a constant of one least significant bit shifted by the coefficient position, can be subsequently compensated for.

In the FIR filter implemented using CSD coefficients, for each filter tap, the number of data values to be added equals the number of non-zero bits in the CSD coefficient, as opposed to the single value generated in a conventional FIR filter. The ones-complement compensations required for each negative CSD coefficient bit in every filter coefficient, as described above, may then be added to generate a single numerical value, known as the global compensation constant for the CSD filter. This global compensation constant is in turn added to the filter sum as one additional input to the data adder 8.

The benefit of the CSD implementation is that the multipliers are eliminated. However, in the CSD implementation, the number of inputs to the data adder 8 is increased. As a consequence of this, the principal criterion in the design of a CSD filter, then, is the minimization of non-zero coefficient bits subject to the constraint of meeting filter performance requirements.

The CSD filter structure, by eliminating the need for multipliers, is clearly a more hardware-efficient implementation of a specific filter (especially in the case of a very long filter) than a conventional FIR structure. However, the CSD structure does not lend itself to a reconfigurable implementation for which any desired coefficients may be programmed. The reason is that for each CSD coefficient the number of data adder inputs per data tap is equal to the number of non-zero bits in the coefficient. Therefore, the structure of the filter is dependent on the coefficient values.

Further, in order for the CSD structure to be more hardware efficient, the shifting of the data tap value required for each coefficient bit is implemented as a hard-wired shift of a data bus. Thus, the shifting of the tap values is also dependent on the coefficient values. Consequently, while the CSD implementation is desirable for a long filter having coefficients that are strictly specified and do not need change, it is not a viable option for any application in which these conditions cannot be guaranteed.

In order to illustrate the difficulties involved in implementing a reconfigurable CSD filter structure, consider without loss of generality, a 100-tap filter with 10-bit coefficient precision. A typical CSD filter has on the average a number of data adder inputs equal to little more than twice the number of filter taps multiplied by the number of bits per coefficient. In this example, this corresponds to not much more than 200 adder inputs (say, up to 250). If there were no restrictions on the CSD coefficient bits, such a filter could have up to 1000 data adder inputs (10 bits, hence 10 inputs, for each of 100 taps, hence 100 coefficients). In addition, the issue of adjusting the number of positions by which each data tap value is shifted has not been addressed.

In the CSD representation, however, a restriction is imposed that two non-zero CSD coefficient bits cannot occupy adjacent bit positions. This means that at most half of all CSD bits can have non-zero values. In the above example, this equals 500 bits. Thus, the maximum number of data adder inputs has been reduced by a factor of two. Although, it is still greater than the typical number by a factor of two, and therefore still very large, it nevertheless represents a substantial improvement. This is especially true if it permits the arbitrary reconfiguration of all filter coefficients, within the constraints of maximum filter length and coefficient bit precision.

Figure 3:
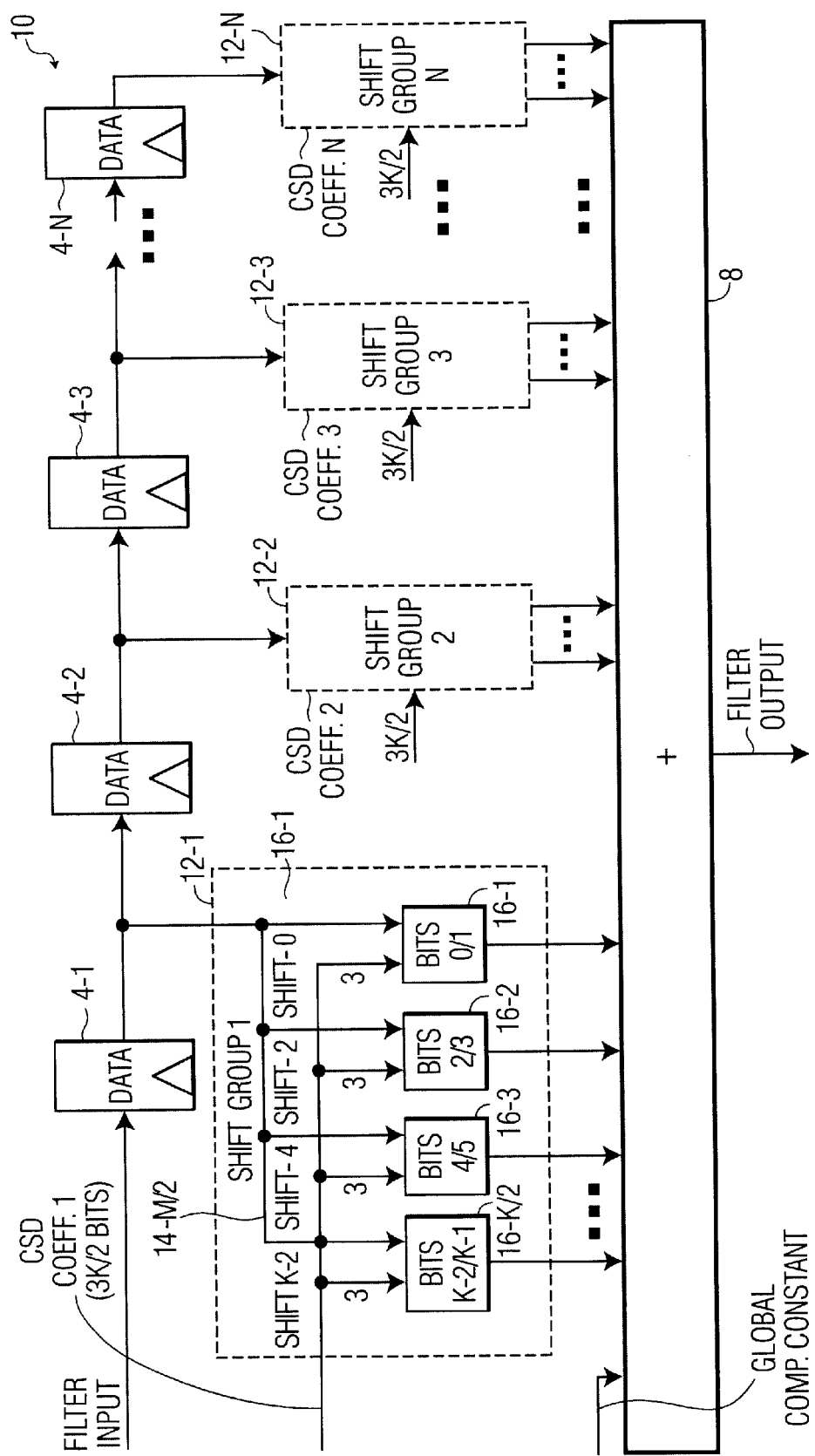
FIG. 3 is a diagram showing one embodiment of the reconfigurable CSD coefficient filter according to the present invention.

One embodiment of reconfigurable CSD coefficient filter according to the present invention is shown in FIG. 3. As can be seen, the reconfigurable CSD coefficient filter 10 also includes data tap registers 4-1–4-N that store the data tap values and an adder 8 for combining the weighted products to produce the filter output. However, in the reconfigurable CSD coefficient filter 10, the weighted products are produced by shift groups 12-1–12-N that are capable of being reconfigured for different sets of CSD coefficients.

In other words, the shift groups 12-1–12-N will weight the data tap values according to the corresponding CSD coefficients. The shift groups 12-1–12-N will perform this function taking advantage of the restriction that two non-zero CSD coefficient bits cannot occupy adjacent positions. This restriction implies that if the coefficient is partitioned into bit pairs, at most one bit within each pair can be non-zero (i.e., one of the two bits may be either +1 or −1, but the other must be 0). Thus, each bit pair of the coefficient is represented by one data tap value shifted by one of only two possible position values, either non-inverted or inverted, or else equal to zero. In any case, only one adder input is required to implement two CSD coefficient bit positions for any permissible values of the two bits.

In order to implement the above scheme, each of the shift groups 12-1–12-N includes a parallel structure for replicating the corresponding data tap value. Each of the parallel paths will include a shifting unit 14 and an adder-input unit 16 for processing each of the replicated data tap values. Each of the parallel paths also corresponds to a different adjacent bit pair in each coefficient. Since the value K is equal to the number of bits in each coefficient, each of the shift groups normally will include K/2 parallel paths.

During operation, each of the shift units 14-1–14-K/2 shift the corresponding data tap value a predetermined number of bit positions. According to the present invention, the predetermined number will be equal to the position within the coefficient of one bit in the corresponding bit pair. In this embodiment, the one bit will be the least significant bit of the corresponding bit pair. Thus, shift unit 14-1 will shift the data tap value from the storage register 4-1 "0" places, shift unit 14-2 will shift the data tap value "2" places, shift unit 14-3 will shift the data tap value "4" places, etc. According to the present invention, it is preferred that the shift units 14-1–14-K/2 are realized by hard wired shifts of the data bus.

Further, the adder-input units 16-1–16-K/2 will perform further logical operations on the data tap values received from the shifting units 14-1–14-K/2 according to the configuration of the corresponding bit pair. As can be seen, each of the adder-input units 16-1–16-K/2 will have three control inputs. According to the present invention, it is preferred that each of the control inputs will be a single bit that corresponds to different configurations of the bit pairs. These control bits will have to be generated off line for different set of coefficients. However, it is well within the skill in art to do this.

As previously described, each of the shift units 14-1–14-K/2 will shift the data tap value according to the position within the coefficient of the least significant bit of the corresponding bit pair. If the first control bit indicates that the most significant bit of the bit pair is zero, then the adder-input units 16-1–16-K/2 will just pass the data tap value received from the shifting units 14-1–14-K/2 unchanged to the adder 8. If the first control bit indicates that the most significant bit of the bit pair is non-zero, then the adder-input units 16-1–16-K/2 will shift the corresponding data tap value one more place.

Further, if the second control bit indicates that both bits of the bit pair are equal to zero, the adder-input units 16-1–16-K/2 will force the corresponding data tap value to zero. If the third control bit indicates that the non-zero bit of the bit pair is negative, the adder-input units 16-1–16-K/2 will invert the corresponding data tap value in order to implement the ones complement. The above described operations of the adder-input units 16-1–16-K/2 are performed according to the configuration of the corresponding bit pairs. This will enable the CSD filter according to the present invention to be reconfigurable to different sets of coefficients.

An example of the operation of one of the shift groups will follow. As can be seen, the shift unit 14-2 and the adder-input unit 16-2 correspond to the Bits 2/3 of CSD Coefficient 1. First, the data tap value from the data tap register 4-1 is shifted by two places by the shift unit 142, which corresponds to the position of the least significant bit of this bit pair. If the least significant bit of the pair, Bit 2, is non-zero, the adder-input unit 16-2 will just pass the data tap value from the shift unit 14-2 unchanged to the adder 8. This is because the data tap value has already been shifted the number of places that corresponds to Bit 2 being non-zero. If the most significant bit of the bit pair, Bit 3, is non-zero, then the adder-input unit 16-2 will shift the corresponding data tap value one more place. Therefore, this data tap value will be shifted a total of three places which corresponds to Bit 3 being non-zero.

Further, if both bits of the bit pair are equal to zero, the adder-input unit 16-2 will force the corresponding data tap value to zero. If the non-zero bit of the bit pair is negative, the adder-input units 16-1–16-K/2 will invert the corresponding data tap value in order to implement the ones complement. This will enable the corresponding data tap value to be subtracted if either of Bits 2/3 is negative. All of the shift units and adder-input units will function similarly to provide the adder 8 with the weighted products. The adder 8 will then combine all of these weighted products to generate a filter output.

Figure 4:
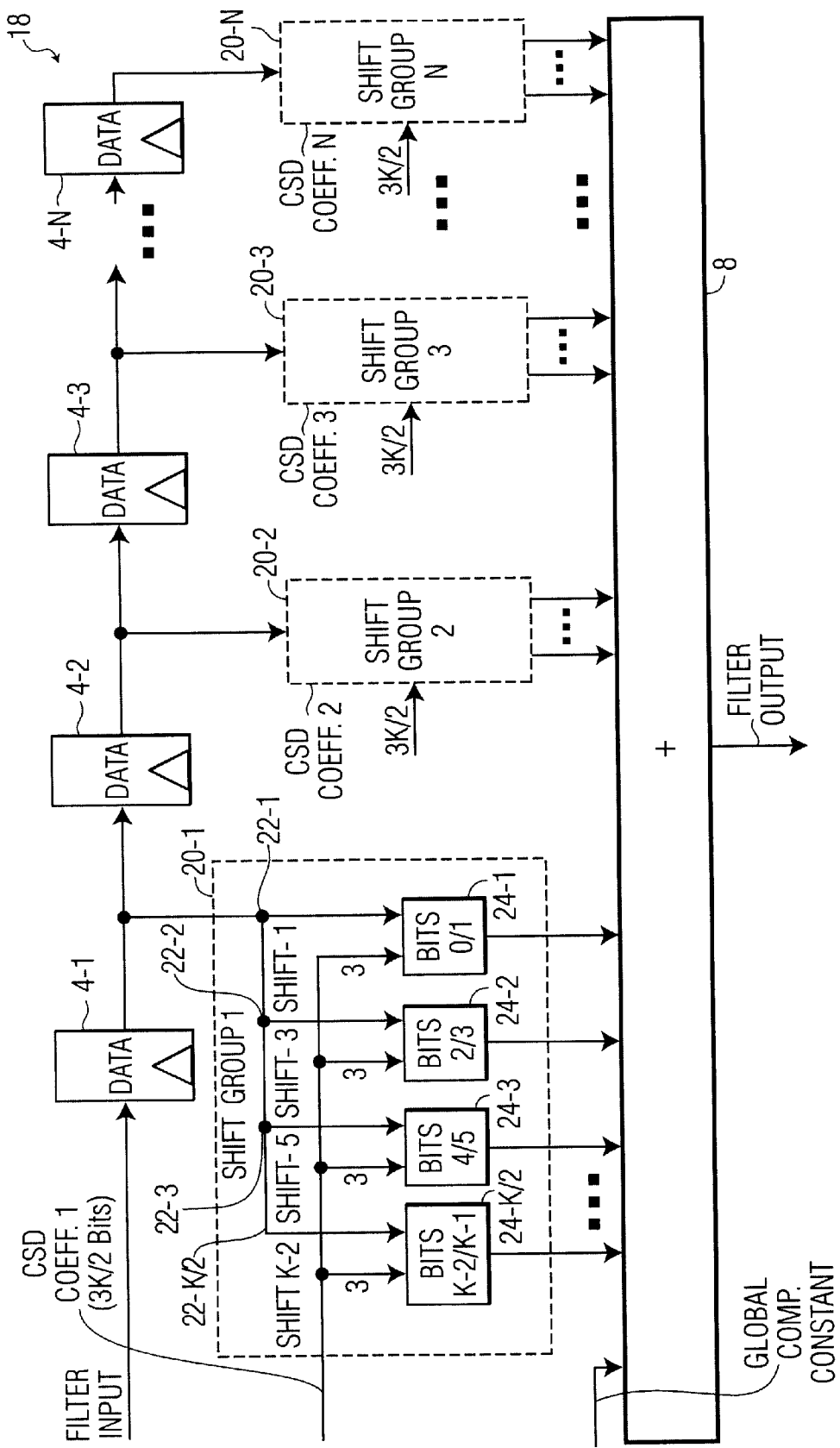
FIG. 4 is a diagram showing another embodiment of the reconfigurable CSD coefficient filter according to the present invention.

Another embodiment of reconfigurable CSD coefficient filter according to the present invention is shown in FIG. 4. This embodiment 18 is the same as the embodiment of FIG. 3 except for shift groups 20-1–20-N. In this embodiment 18, the shift units 22-1–22-K/2 will shift the corresponding data tap value according to the position within the coefficient of the most significant bit of each bit pair. Therefore, the shift unit 22-1-1 will shift the data tap value from the storage register 4-1 "1" place, shift unit 22-2 will shift the data tap value "3" places, shift unit 22-3 will shift the data tap value "5" places, etc.

Further, the adder-input units 24-1–24-K/2 will also perform further logical operations on the data tap values received from the shifting units 22-1–22-K/2 according to the configuration of the corresponding bit pair. However, in this embodiment, if the most significant bit of the corresponding bit pair is non-zero, the adder-input units 24-1–24-K/2 will pass the corresponding data tap values from the shifting units 22-1–22-K/2 unchanged to the adder 8. If the least significant bit of the bit pair is non-zero, then the adder-input units 24-1–24-K/2 will shift the corresponding data tap value one position. In this case the data tap value must be shifted toward the least significant bit. Previously, all the shifts were presumed to be toward the most significant bit.

Figure 5:
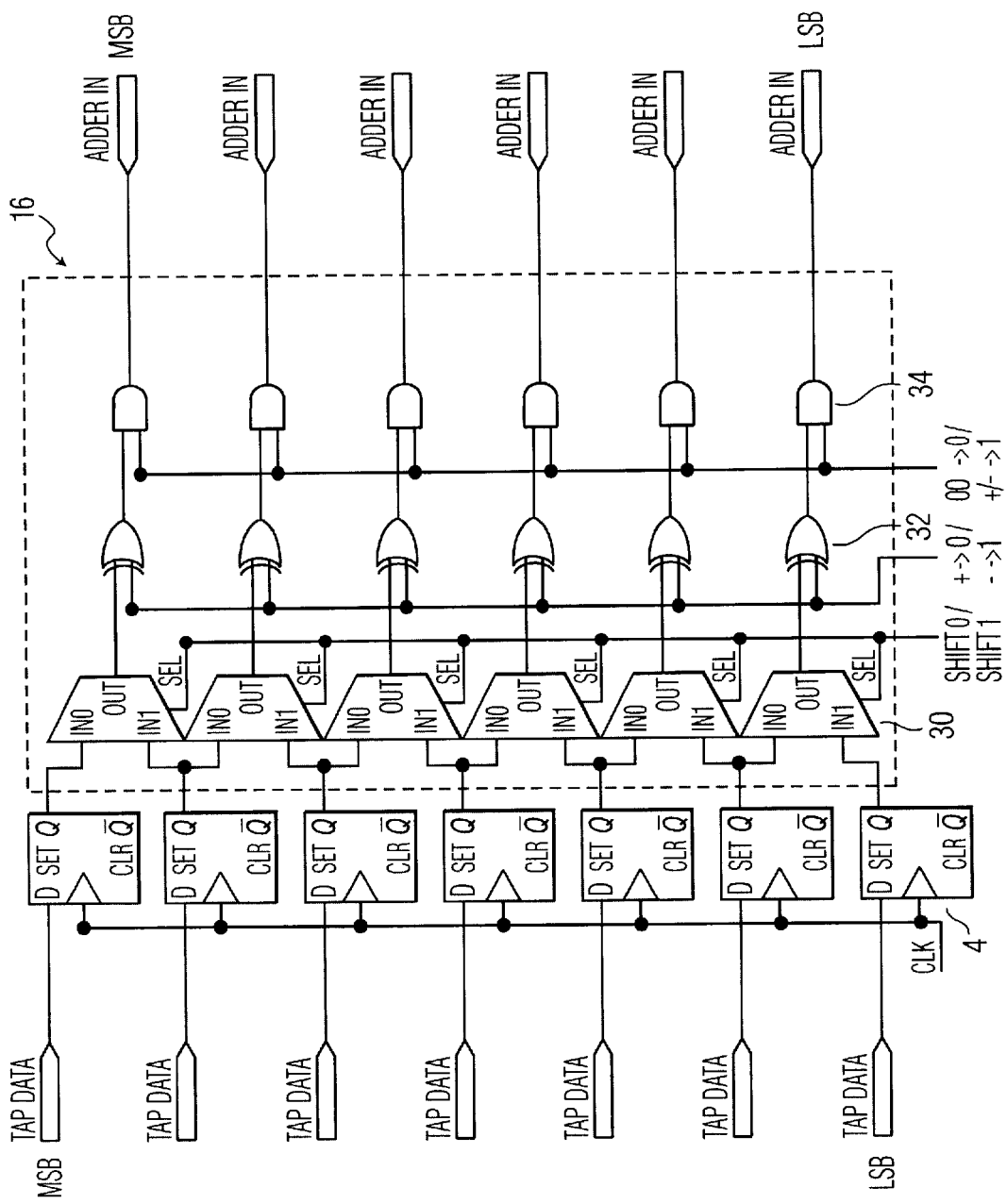
FIG. 5 is a diagram showing one example of the adder-input unit of FIG. 3 according to the present invention.

One example of the adder-input unit of FIG. 3 is shown in FIG. 5. The logic gates included in each of the adder-input units 16 is enclosed by the broken line box. For purposes of explanation, one of the data tap registers of FIG. 3 is included in this figure. In particular, the connections between the data tap register 4 and adder-input unit 16 is shown. However, it should be noted that the data tap register 4 does not form part of the adder input unit 16.

Each of the adder-input units 16 include logic that perform the logical operations on the data tap values according to the three control inputs, as previously described.

In the adder-input unit 16, the two permitted data shifts for one pair of coefficient bits is implemented using two-input data multiplexers 30, using the first control bit to select the non-zero CSD bit position. The sign of the selected bit is implemented using bit-wise exclusive-OR gates 32 controlled by the third control bit that is asserted when the CSD bit equals −1 and data inversion is required. Finally, the case where both CSD bits equal zero is implemented using bit-wise AND gates 34, which force all data bits to zero if disabled by the second control bit (independently of the values of the first two bits). The specific implementations described serve to illustrate the required logic, and not to specify a unique or even preferred implementation, as this logic can be optimized using any of a number of well-known logic reduction techniques.

Figure 6:
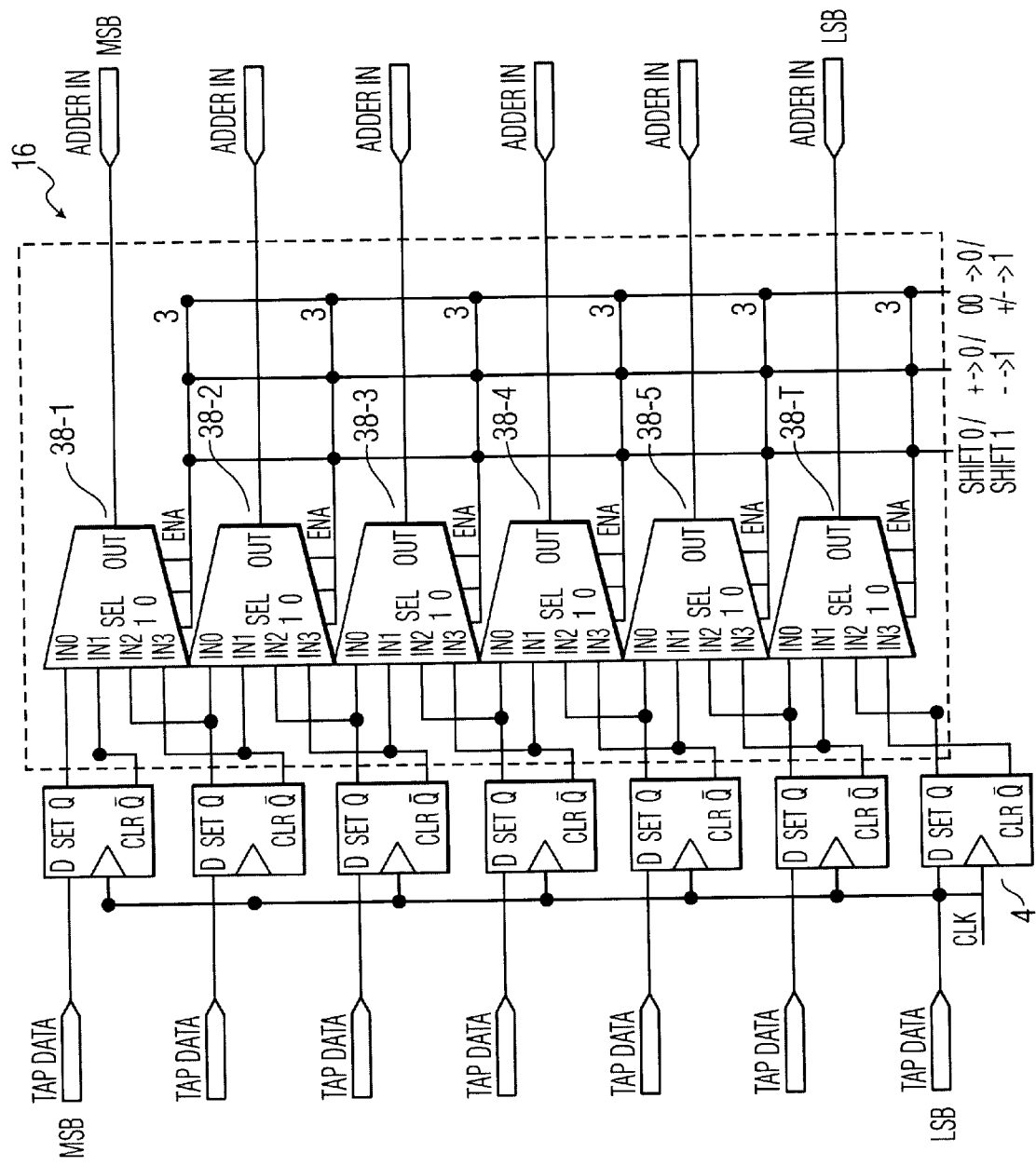
FIG. 6 is a diagram showing a more hardware optimal example of the adder-input unit of FIG. 3 according to the present invention.
Figure 7:
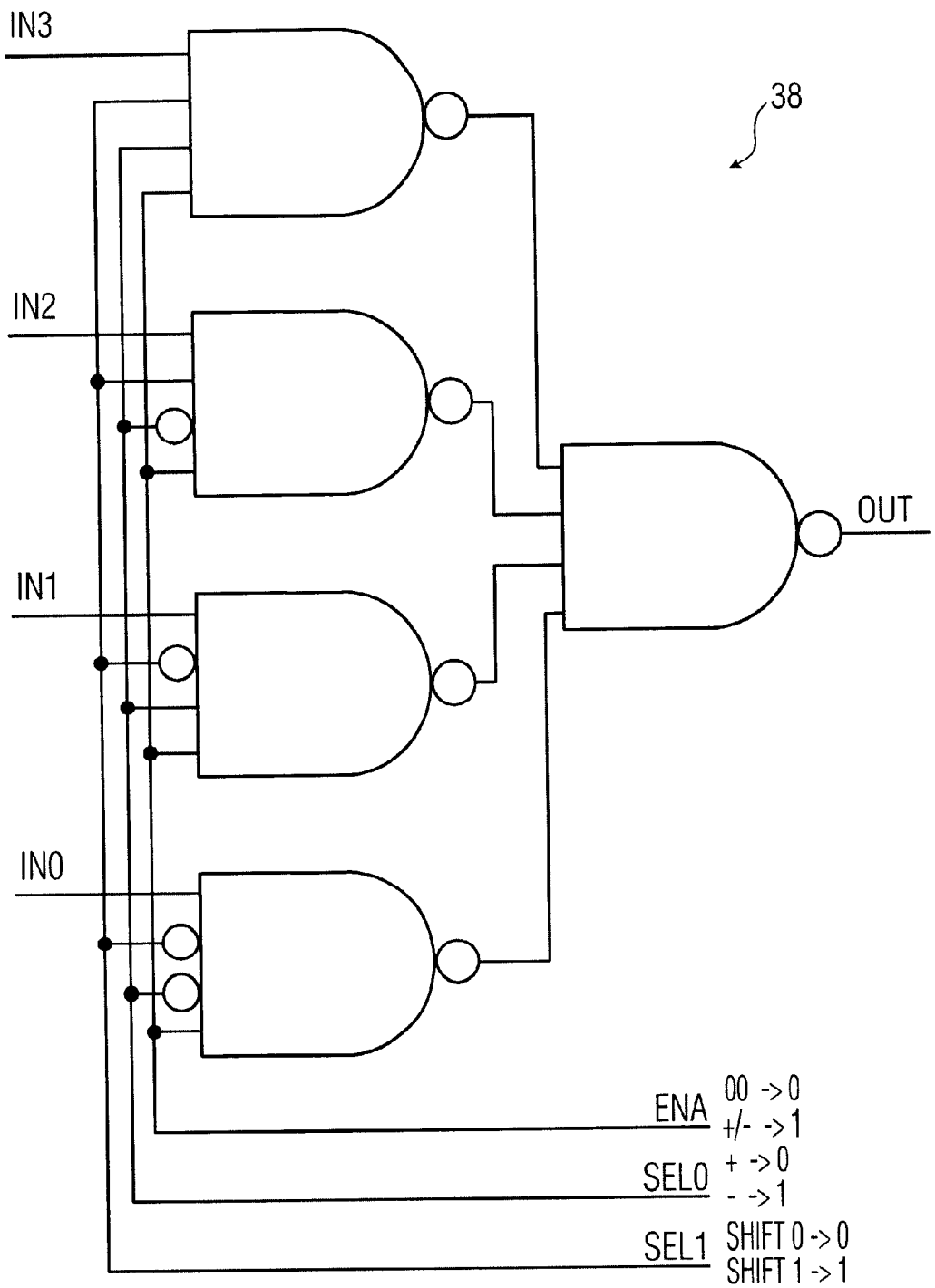
FIGS. 7–8 are diagrams showing examples of the four input multiplexer shown in FIG. 5.

A more hardware optimal example of the adder-input unit of FIG. 3 is shown in FIG. 6. As can be seen, the adder-input unit 16 is also enclosed by the broken line box and one of the data tap registers 4 are included to show the connection between the two. In this example, the adder-input unit 16 performs the same logical operations as described in regard to FIG. 5. However, in this example, the adder-input unit 16 has been simplified to a parallel arrangement of four-input multiplexers 38-1–38-T, where T corresponds to the number of bits in each of the data tap values. A standard logic implementation of such a four-input multiplexer 38 is shown in FIG. 7.

Figure 8:
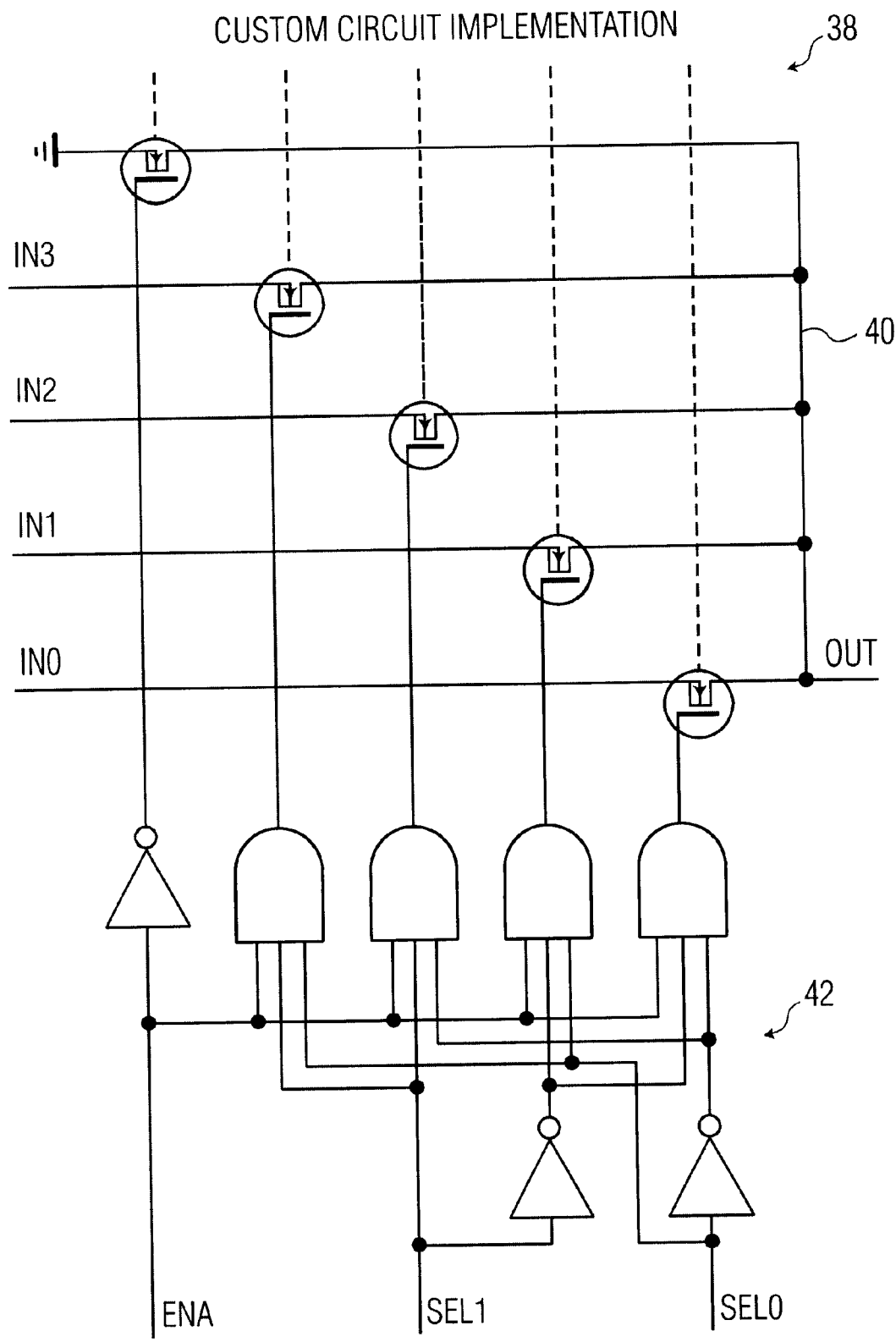

A custom circuit implementation of the four-input multiplexer 38 of FIG. 6 is shown in FIG. 8. In this implementation, each of the four-input multiplexers 38 include the parallel arrangement of transistors 40, as shown. However, only one set of logic gates 42 is required for all of the parallel arrangements of transistors 40. Thus, this set of logic gates 42 will be common in all of the multiplexers 38. Therefore, the custom circuit implementation will be more hardware efficient than the standard logic implementation of FIG. 7 since less logic gates are required.

Figure 9:
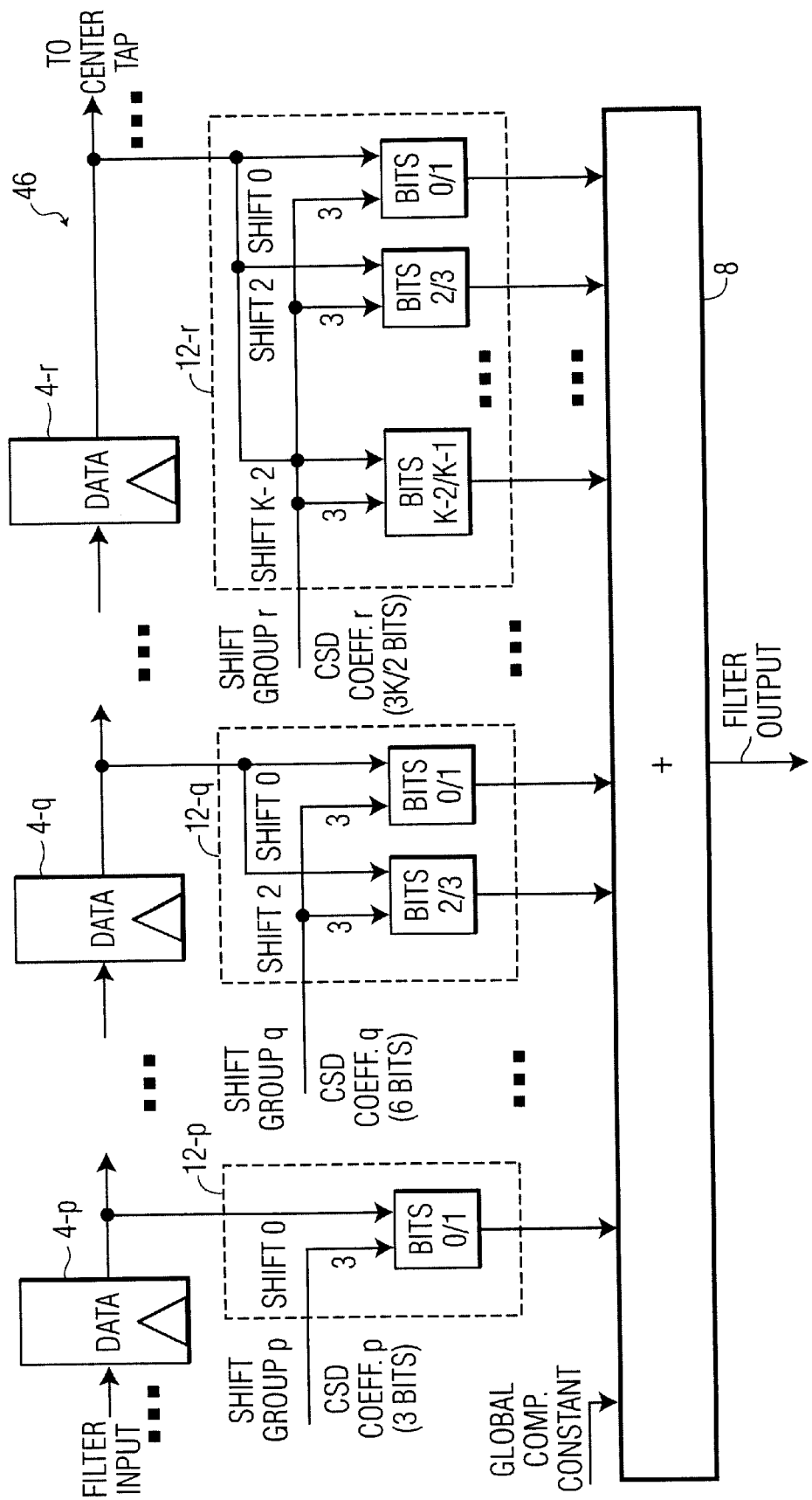
FIG. 9 is a diagram showing another embodiment of the reconfigurable CSD coefficient filter according to the present invention.

Another embodiment of reconfigurable CSD coefficient filter according to the present invention is shown in FIG. 9.

As can be seen, the reference numbers in this figure include the letters "p", "q" and "r". The letter "p" represents devices far from the center tap of the filter, "q" represents devices nearer to the center tap and "r" represents devices at or very near the center tap. In this embodiment 46, the shift groups far from the center tap 12-p and shift groups nearer the center tap 12-q are configured not to utilize all of the parallel paths associated with each of the bit pairs.

As can be seen, in shift group 12-p only the parallel path associated with Bits 0/1 are utilized, in shift group 12-q only the parallel paths associated with Bits 0/1 and 2/3 are used etc. Based on this configuration, less shift units and adder-input units is required by this embodiment 46. Therefore, this embodiment 46 will reduce the amount of hardware required than the previous embodiments.

The justification for the embodiment of FIG. 9 is as follows. In order to implement a reconfigurable CSD filter, additional logic is required for each data adder input, as well as the substantially larger number of such inputs relative to that required for a fixed-coefficient filter (which in turn also affects the number of data logic circuits required). Although, the first of these penalties cannot be eliminated, the second can be greatly reduced by considering the properties of practical FIR filters.

With the exception of some poly-phase filters used for sampling rate conversion, virtually all digital filters of any significant length have the property that all large coefficients are located very near the center tap(s) of the filter. This becomes especially true as the length of the filter increases. Since CSD implementations are mainly of interest for very long filters, this is an important consideration. As a rule, the further away that a tap is from the center, the smaller its coefficient magnitude will be. In the case of CSD coefficients, this means that bits corresponding to magnitudes above the maximum range of a given coefficient will always be zero. Where this is the case for at least two high-order bits, every such bit-pair in the above representation yields a data adder input value of zero, so that neither the input nor the associated logic for that input is required.

Further, for a given maximum filter length and bit precision, the maximum practical range of each CSD coefficient can be determined as a function of tap distance from the center tap(s). All bit pairs that correspond to magnitudes exceeding this range can therefore be entirely eliminated. This will reduce the number of adder inputs to a value not much greater than the average number for a typical fixed-coefficient filter of the same length and precision. The only remaining penalty is in the data logic required for each input, in exchange for which the benefits of reconfigurability and programmability are now available. Therefore, the embodiment of CSD filter shown in FIG. 9 takes advantage of the above discussed characteristics of practical filters by eliminating the hardware associated with some of the bit pairs included in coefficients that are not at or adjacent to the center tap of the filter.

Even further hardware reduction can be achieved if it is guaranteed that a particular filter will be used exclusively for a small number of specific applications (e.g., in a digital demodulator that supports only certain modulation standards) such that only that number of filters need be supported. In this case, the reconfigurable CSD filter structure of FIG. 9 only has to support those coefficient bit pairs that are used in at least one of the required filters. Those bit pairs that are not needed in any of the filters can be eliminated, along with their data adder input and associated logic, regardless of their position in the coefficient or of that of the coefficient in the filter itself. If the CSD coefficient design of all required filters is designed with the additional criterion of minimizing the total number of coefficient bit pairs that are used by any of the filters, this will result in an even more substantial reduction in the filter hardware.

Figure 10:
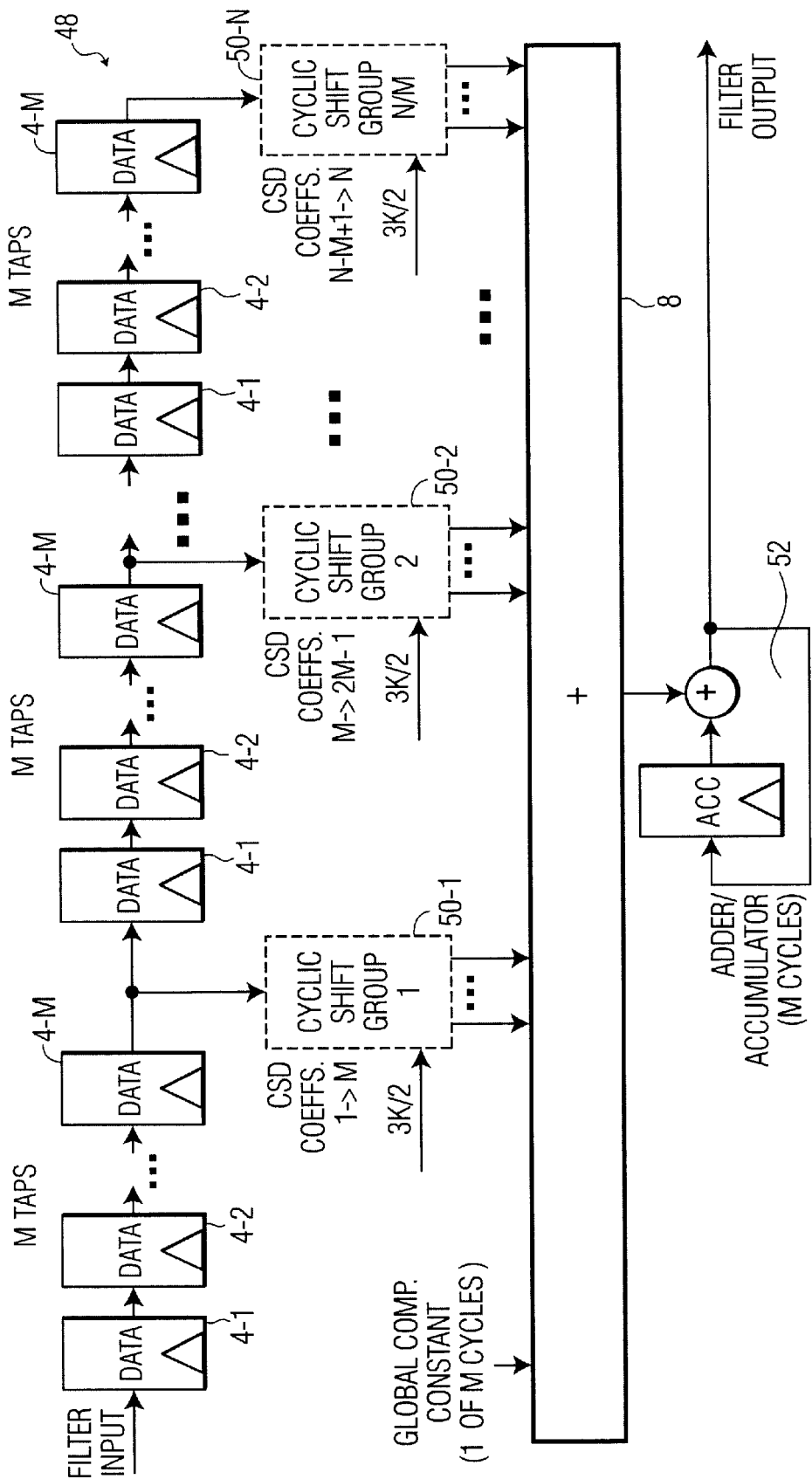
FIG. 10 is a diagram showing another embodiment of the reconfigurable CSD coefficient filter according to the present invention.

Another embodiment of reconfigurable CSD coefficient filter according to the present invention is shown in FIG. 10. In this embodiment 48, the technique of resource sharing is used in order to further reduce the hardware required. Resource sharing involves the multiplication of two or more data tap values by the associated coefficients over an equal number of processing (clock) cycles during one data sampling interval and accumulating (adding) the results. In a reconfigurable CSD filter, the use of resource sharing will reduce the number of data adder inputs.

As can be seen from FIG. 10, each of the cyclic shift groups 50-1–50-N/M is associated with M data tap registers 4-1–4-M. Each of the shift groups 50-1–50-N/M is configured the same to operate as the shift groups in FIG. 3. However, in this embodiment 48, each of the cyclic shift groups 50-1–50-N/M is associated with M CSD coefficients instead of only one. This will enable each of the shift groups 50-1–50-N/M to rotate through each of the M coefficients in order to process the data from each group of data tap registers 4-1–4-M over M cycles. At the output of the adder 8 is an accumulator 52 for accumulating and adding the results over the M cycles.

The sharing of coefficients within a given group of resource-shared taps is implemented by cyclically "rotating" through the CSD representations for each of the coefficients in that group. This is done for all such groups in the filter, and the result is accumulated at the output of the data adder. As always, resource sharing provides the greatest benefit in the case of a very long filter. Since sharing is performed among adjacent data taps, which are by definition at roughly the same distance from the center tap(s), the ranges of the respective shared coefficients are essentially equal, so that the above-described technique of limiting coefficient ranges as a function of distance from the center tap(s) to reduce data adder inputs can be applied to the case of a CSD filter that uses resource sharing as well.

The reconfigurable filter according to the present invention lends itself to efficient implementation on an integrated circuit and thus represents an advancement in the state of the FIR filter art in that it permits the CSD representation of filter coefficients, with the resulting elimination of hardware multipliers, to be used in a reconfigurable and programmable FIR filter.

Further, the foregoing description of the invention has been presented for the purposes of illustration and description. It is not intended to limit the invention to the precise forms disclosed. Many modifications and variations are possible in light of the above teachings. Therefore, it is not intended that the scope of the invention should be limited by the detail description.

What is claimed is:

1. A finite impulse response filter for processing data tap values with canonical sign digit (CSD) coefficients, comprising:

a shift group associated with at least one of the data tap values and at least one of the CSD coefficients, each shift group including a plurality of parallel paths, each parallel path being associated with a bit pair of the coefficient and for shifting the data tap value according to the bit pair producing a weighted product; and an adder for combining the weighted products from each of the shift groups.

2. The filter of claim 1, wherein each parallel path includes a shift unit for shifting the data tap value a predetermined number of places corresponding to a position within the one coefficient of a first bit of the bit pair.

3. The filter of claim 2, wherein the first bit is a least significant bit of the bit pair.

4. The filter of claim 2, wherein the first bit is a most significant bit of the bit pair.

5. The filter of claim 2, wherein each parallel path further includes an adder-input unit coupled to an output of the shift unit for further shifting the data tap value if a second bit of the bit pair is non-zero.

6. The filter of claim 5, wherein the adder-input unit passes the data tap value from the shift unit unchanged to the adder if the second bit of the bit pair is zero.

7. The filter of claim 5, wherein the second bit is a most significant bit of the bit pair.

8. The filter of claim 5, wherein the second bit is a least significant bit of the bit pair.

9. The filter of claim 5, wherein the adder-input unit forces the data tap value from the shift unit to zero if both bits of the bit pair are zero.

10. The filter of claim 5, wherein the adder-input unit inverts the data tap value from the shifting unit if one bit of the bit pair is negative.

11. The filter of claim 1, wherein the shift groups away from a center tap of the filter do not utilize all of the parallel paths.

* * * * *